(12) United States Patent
Lee

(10) Patent No.: US 7,387,941 B2
(45) Date of Patent: Jun. 17, 2008

(54) METHOD FOR FABRICATING SEMICONDUCTOR DEVICE

(75) Inventor: Eun Sung Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 245 days.

(21) Appl. No.: 11/404,670

(22) Filed: Apr. 13, 2006

(65) Prior Publication Data

US 2007/0173005 A1    Jul. 26, 2007

(30) Foreign Application Priority Data

Jan. 23, 2006   (KR) ............... 10-2006-0006968

(51) Int. Cl.
*H01L 21/76*   (2006.01)
*H01L 21/44*   (2006.01)

(52) U.S. Cl. ..................... 438/429; 438/442

(58) Field of Classification Search ............... 438/413, 438/416, 429, 442; 257/647–649
See application file for complete search history.

(56) References Cited

U.S. PATENT DOCUMENTS 5,214,603 A * 5/1993 Dhong et al. ............... 365/207
6,093,614 A * 7/2000 Gruening et al. ........... 438/388

FOREIGN PATENT DOCUMENTS

KR   10-2005-0019363 A   3/2005
KR   10-2005-0043424 A   5/2005

* cited by examiner

*Primary Examiner*—Calvin Lee
(74) *Attorney, Agent, or Firm*—Townsend and Townsend and Crew LLP

(57) ABSTRACT

A method for manufacturing a semiconductor device in accordance with an embodiment of the present invention provides a channel region formed over a device isolation structure to form a semiconductor device including a SOI (Silicon-on-Insulator) channel structure, thereby decreasing ion implanting concentration of a channel region and improving $t_{WR}$ (Write Recovery time) and LTRAS (Long Time for Row Address Strobe) characteristics of the device.

12 Claims, 8 Drawing Sheets

METHOD FOR FABRICATING SEMICONDUCTOR DEVICE

BACKGROUND OF THE INVENTION

The present invention relates to a method for fabricating a memory device. In particular, the present invention relates to a method for fabricating a semiconductor device wherein an epitaxial layer is formed over a device isolation structure of a recess gate region to form a semiconductor device including a SOI (Silicon-on-Insulator) channel structure, thereby decreasing ion implanting concentration of a channel region and improving $t_{WR}$ (Write Recovery time) and LTRAS (Long Time for Row Address Strobe) characteristics of the device.

FIG. 1 is a simplified layout of a conventional semiconductor device, wherein reference numerals 1, 3, and 5 denote an active region, a recess gate region, and a gate region, respectively.

FIGS. 2a through 2f are simplified cross-sectional views illustrating one method for fabricating a semiconductor device, wherein the cross-sectional views are taken along the line I-I' of FIG. 1.

Referring to FIG. 2a, a device isolation structure 20 is formed on a semiconductor substrate 10 having a pad oxide film 13 and a pad nitride film 15.

Referring to FIG. 2b, the pad nitride film 15 is removed. Ion implanting process is then performed on the entire surface to form a well and ion implantation region (not shown) in the semiconductor substrate 10. Next, a planarized polysilicon layer 25 is formed on the entire surface of the resultant.

Referring to FIG. 2c, the polysilicon layer 25 and the pad oxide film 13 are etched using a recess gate mask (not shown) as an etching mask to form a polysilicon layer pattern 25a and a pad oxide film pattern 13a to define the recess gate region 3 shown in FIG. 1.

Referring to FIG. 2d, the semiconductor substrate 10 of the recess gate region 3 shown in FIG. 1 is etched to form a recess 35. The polysilicon layer pattern 25a is removed during a process for forming the recess 35.

Referring to FIG. 2e, the pad oxide film pattern 13a is removed to expose the semiconductor substrate 10. A gate insulating film 60 is then formed over the exposed semiconductor substrate 10. Next, a planarized gate conductive layer 65 filling up the recess 35 is formed. A hard mask layer 90 is then formed on the gate conductive layer 65. The gate conductive layer 65 includes a stacked structure of a lower gate conductive layer 70 and an upper gate conductive layer 80.

Referring to FIG. 2f, the hard mask layer 90 and the gate conductive layer 65 are patterned using a gate mask (not shown) as an etching mask to form a gate 99.

However, according to the above method for fabricating a semiconductor device, the gate is inefficient with respect to channel controllability. Moreover, reliability of the device is degraded due to a body effect as bias voltage level of the device varies.

BRIEF SUMMARY OF THE INVENTION

According to the present invention, techniques for a method for fabricating a memory device are provided. In particular, the present invention provides a method for fabricating a semiconductor device wherein an epitaxial layer is formed over a device isolation structure of a recess gate region to form a semiconductor device including a SOI (Silicon-on-Insulator) channel structure, thereby decreasing ion implanting concentration of a channel region and improving $t_{WR}$ (Write Recovery time) and LTRAS (Long Time for Row Address Strobe) characteristics of the device.

In one embodiment of the present invention, a method for fabricating a semiconductor device includes: (a) forming a device isolation structure defining an active region on a semiconductor substrate having a pad insulating film; (b) forming a hard mask layer pattern on the entire surface of the resultant, the hard mask layer pattern exposing the device isolation structure and the pad insulating film in a recess region; (c) etching the exposed device isolation structure using the hard mask layer pattern as an etching mask to form a recess exposing sidewalls of the active region; (d) removing the hard mask layer pattern; (e) forming an epitaxial layer in the recess using the exposed sidewalls of the active region as a seed layer; (f) selectively etching the epitaxial layer by a predetermined thickness to form a SOI (Silicon-on-Insulator) channel region in the recess; (g) removing the pad insulating film to expose the active region; (h) forming a gate insulating film over the exposed active region including the SOI channel region; (i) forming a planarized gate conductive layer filling up the recess and a gate hard mask layer; and (j) patterning the gate hard mask layer and the gate conductive layer using a gate mask as an etching mask to form a gate.

DETAILED DESCRIPTION OF THE INVENTION

Reference will now be made in detail to exemplary embodiments of the present invention. Wherever possible, the same reference numbers will be used throughout the drawings to refer to the same or like parts. It should be appreciated that the embodiments are provided to describe and enable the invention to those skilled in the art. Accordingly, the embodiments described herein may be modified without departing from the scope of the present invention.

Figure 1:
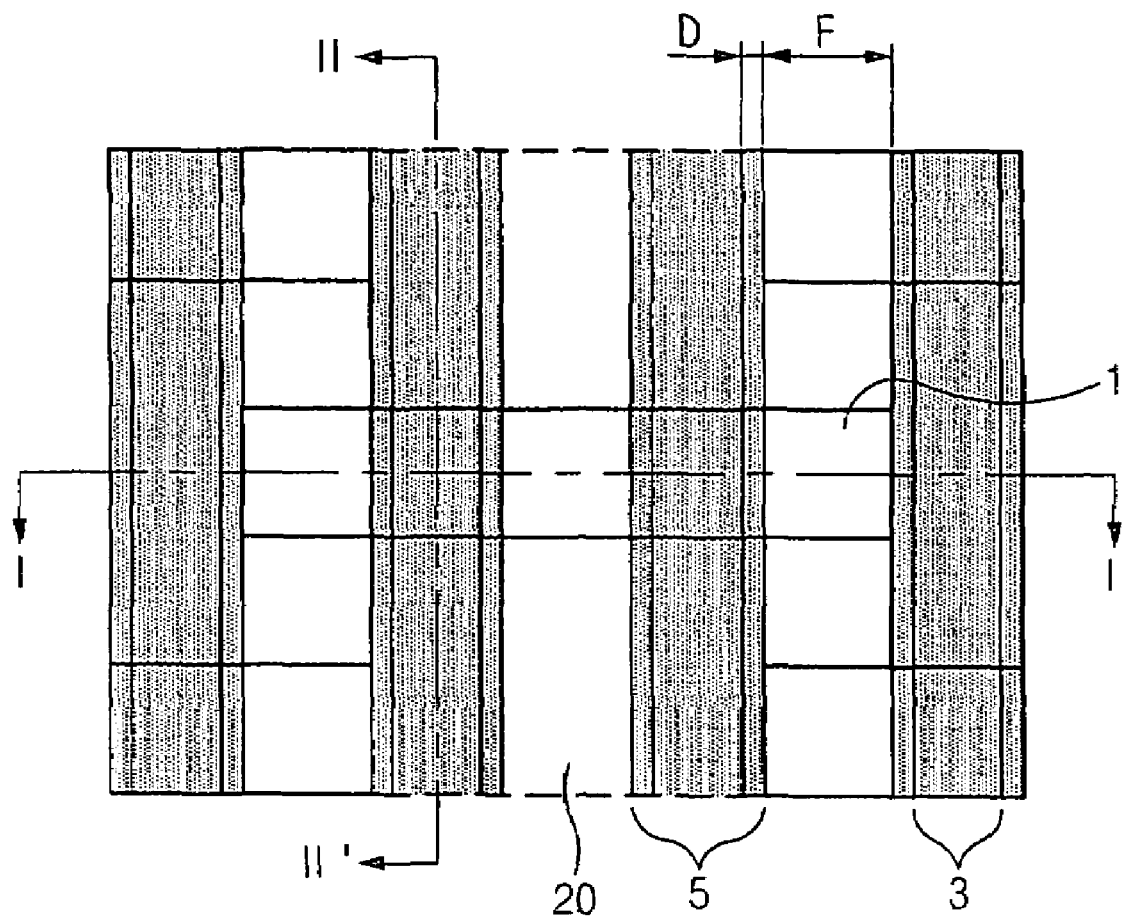
FIG. 1 is a simplified layout of a conventional semiconductor device.
Figure 2A:
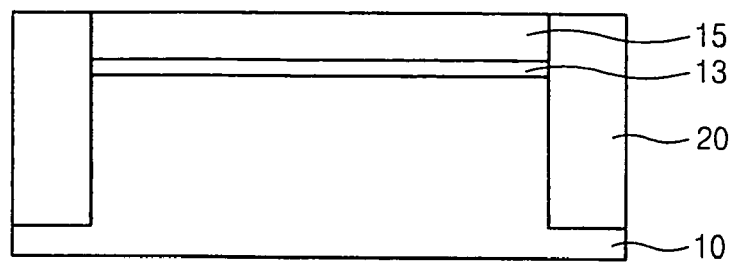
FIGS. 2a through 2f are simplified cross-sectional views illustrating one method for fabricating a conventional semiconductor device.
Figure 2B:
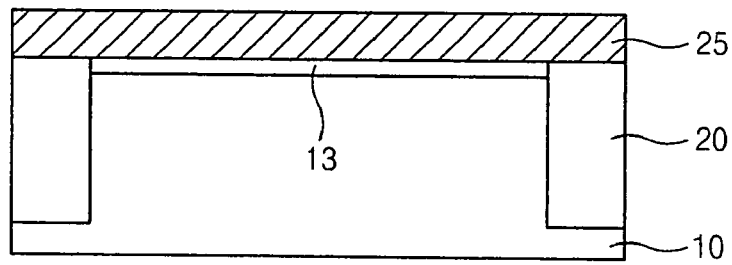
Figure 2C:
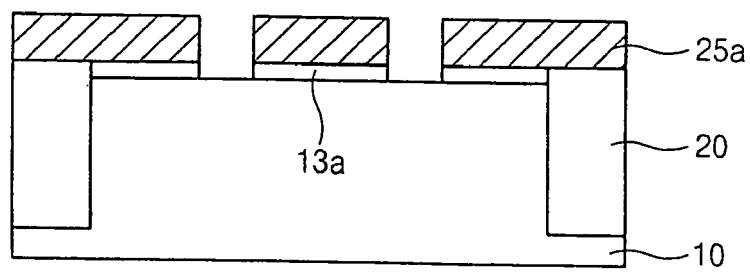
Figure 2D:
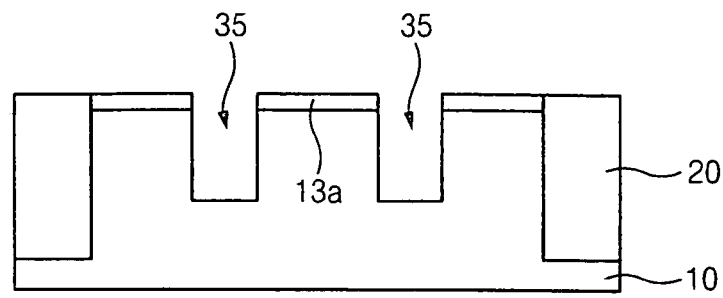
Figure 2E:
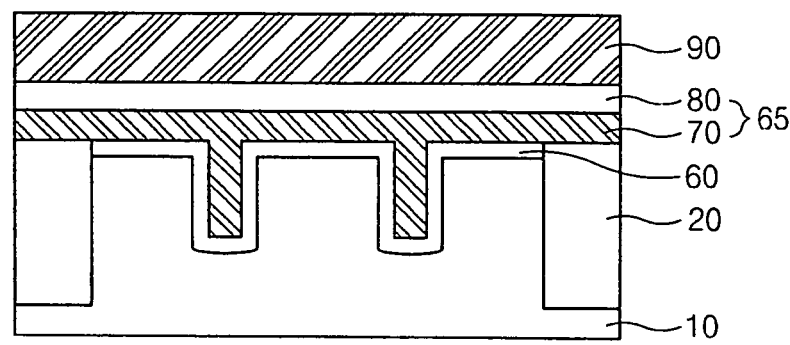
Figure 2F:
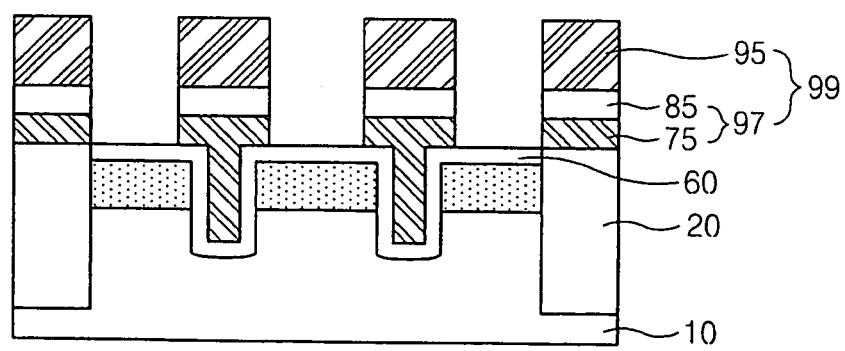
Figure 3:
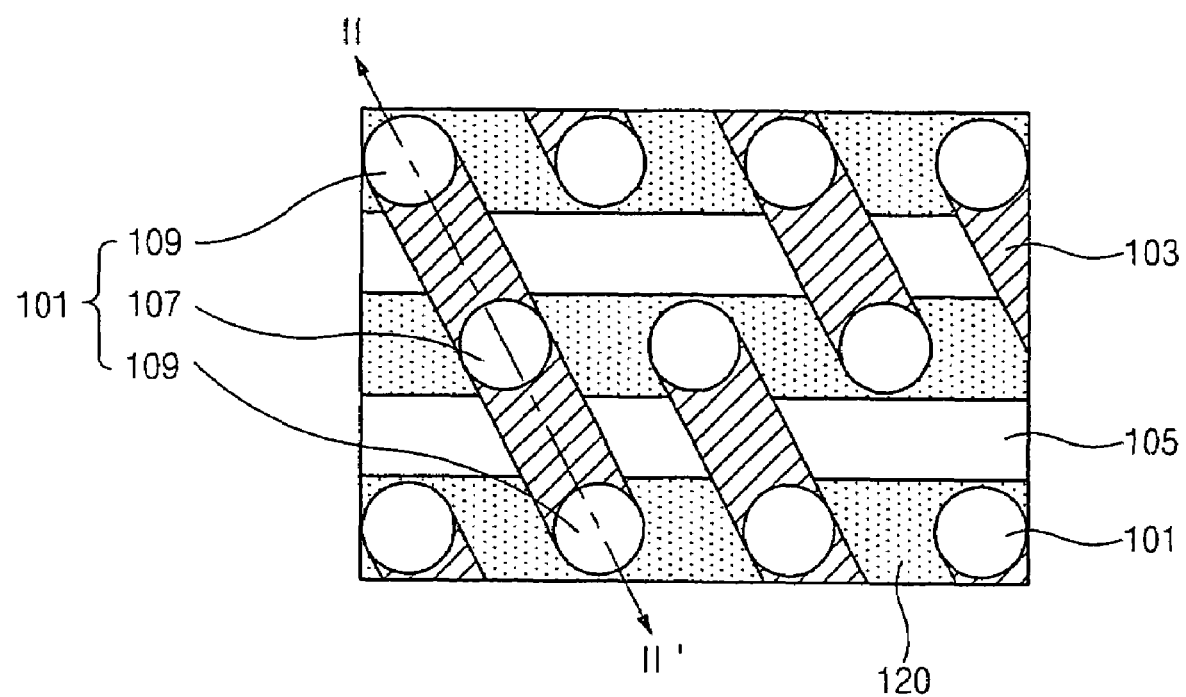
FIG. 3 is a simplified layout of a semiconductor device according to an embodiment of the present invention.

FIG. 3 is a simplified layout of a semiconductor device according to an embodiment of the present invention, wherein reference numerals 101, 103, and 105 denote an active region defined by the device isolation structure 120, a recess gate region, and a gate region, respectively.

Referring to FIG. 3, the active region 101 is disposed at the semiconductor substrate of a bit line contact region 107 and a storage node contact region 109. The recess region (or opening) 103 is a region extending from the bit line contact region 107 to its neighboring storage node contact regions 109. The gate region 105 is disposed at a region between the bit line contact region 107 and its neighboring storage node contact region 109, i.e., within the device isolation structure 120 (or isolation structure of first type) that is provided between the bit line contact region 107 and its neighboring storage node contact region 109. The device isolation structures of first type are formed with other device isolation structures (isolation structures of second type). The device isolation structure of first type is later used to form a gate region/structure unlike the device isolation structures of second type. Accordingly, such a device isolation structure of first type is also referred to as a "device isolation structure".

FIGS. 4a through 4i are simplified cross-sectional views illustrating a method for fabricating a semiconductor substrate in accordance with an embodiment of the present invention, wherein the cross-sectional views are taken along the line II-II' of FIG. 3.

Figure 4A:
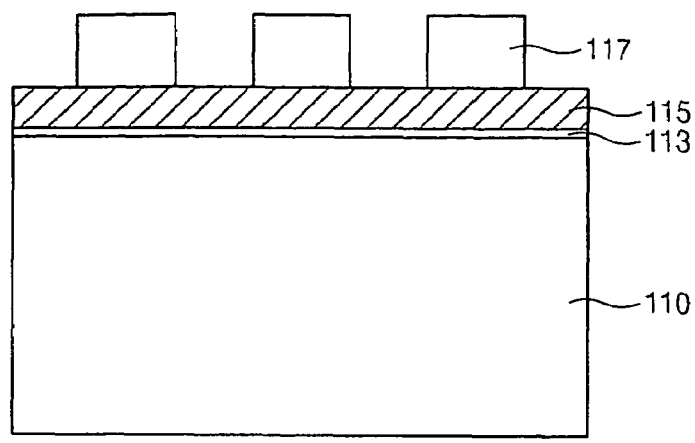
FIGS. 4a through 4i are simplified cross-sectional views illustrating a method for fabricating a semiconductor device according to an embodiment of the present invention.
Figure 4B:
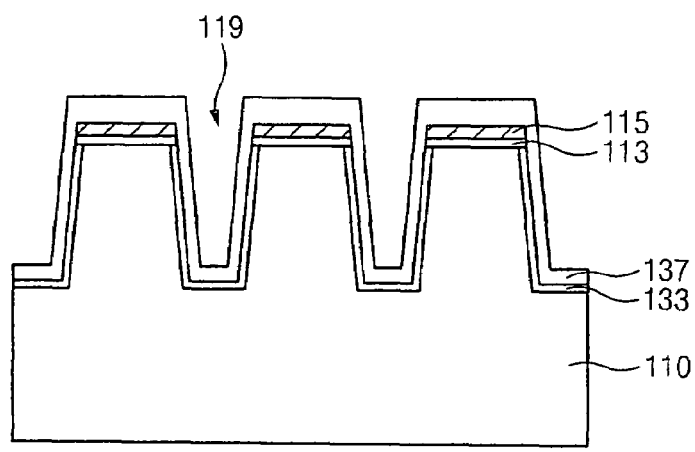

Referring to FIGS. 4a and 4b, a pad oxide film 113, a pad nitride film 115 and a photoresist film (not shown) are formed over a semiconductor substrate 110, and then exposed and developed using a mask defining the active region 101 shown in FIG. 3 to form a photoresist film pattern 117. Next, the pad nitride film 115, the pad oxide film 113 and the semiconductor substrate 110 are etched using the photoresist film pattern 117 as an etching mask by a predetermined thickness to form a trench 119 defining the active region 101 shown in FIG. 3. The photoresist film pattern 117 is then removed. Thereafter, a liner oxide film 133 is formed at sidewalls of the trench 119. A liner nitride film 137 is then formed on the entire surface of the resultant.

Figure 4C:
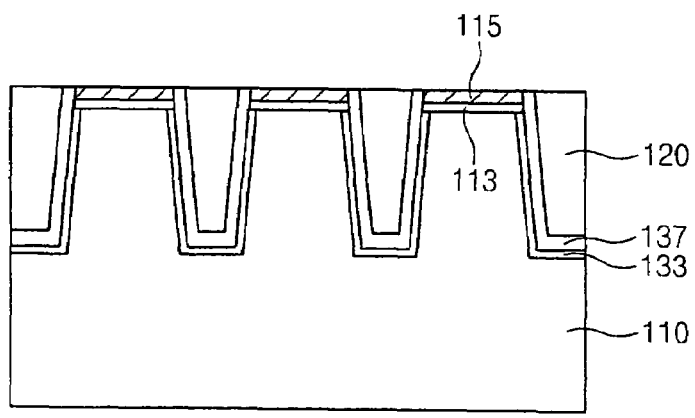
Figure 4D:
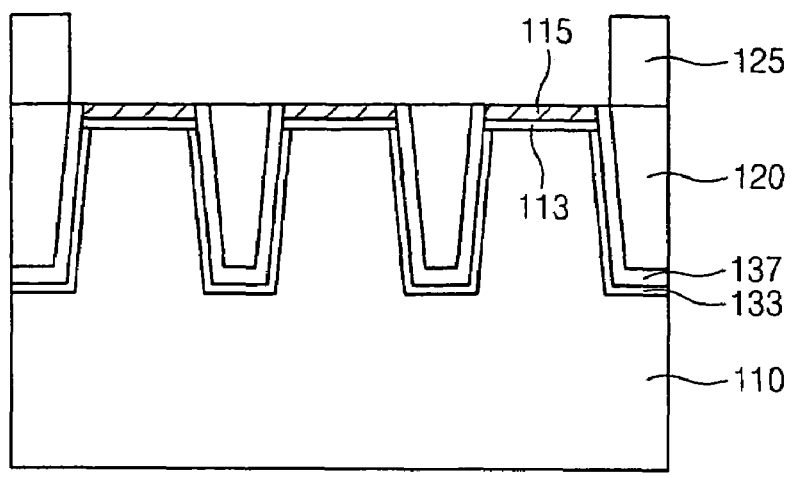

Referring to FIGS. 4c and 4d, an insulating film for device isolation (not shown) filling up the trench 119 is formed on the entire surface of the resultant. Until the pad nitride film 115 is exposed, the insulating film for device isolation is then polished to form a device isolation structure 120. Next, a hard mask layer (not shown) is formed on the entire surface of the resultant. Thereafter, a photoresist film (not shown) is formed on the hard mask layer, and then exposed and developed using a mask defining the recess region 103 shown in FIG. 3 to form a photoresist film pattern (not shown). After that, the hard mask layer is etched using the photoresist film pattern as an etching mask to form a hard mask layer pattern 125 exposing the device isolation structure 120 and the pad nitride film 115 in the recess region 103 shown in FIG. 3. The photoresist film pattern is then removed. In some embodiments, the hard mask layer is made from a nitride film, a polysilicon film, an amorphous Carbon film, a SiON film, or combinations thereof.

Figure 4E:
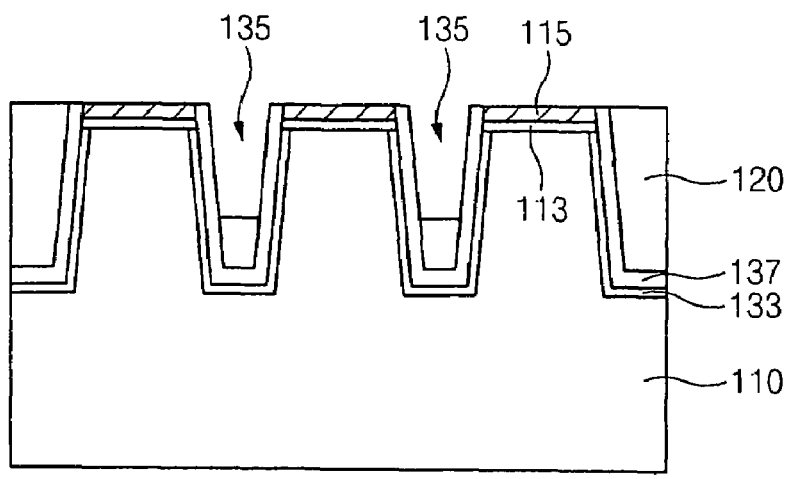
Figure 4F:
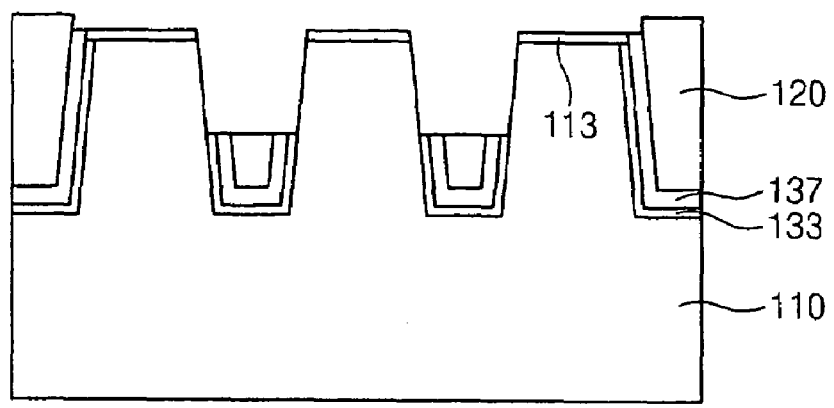

Referring to FIGS. 4e and 4f, the exposed device isolation structure 120 is etched using the hard mask layer pattern 125 as an etching mask by a predetermined thickness to form a recess 135. The hard mask layer pattern 125 is then removed. Next, the pad nitride film 115 and the liner nitride film 137 exposed in the recess 135 are removed. Thereafter, the liner oxide film 133 exposed in the recess 135 is selectively removed to expose the semiconductor substrate 110 at sidewalls of the recess 135. In some embodiments, a process for removing the pad nitride film 115 and the liner nitride film 137 is performed by a wet or dry etching method. The liner oxide film 133 exposed in the recess gate region 135 may be removed by an anisotropic etching method.

Figure 4G:
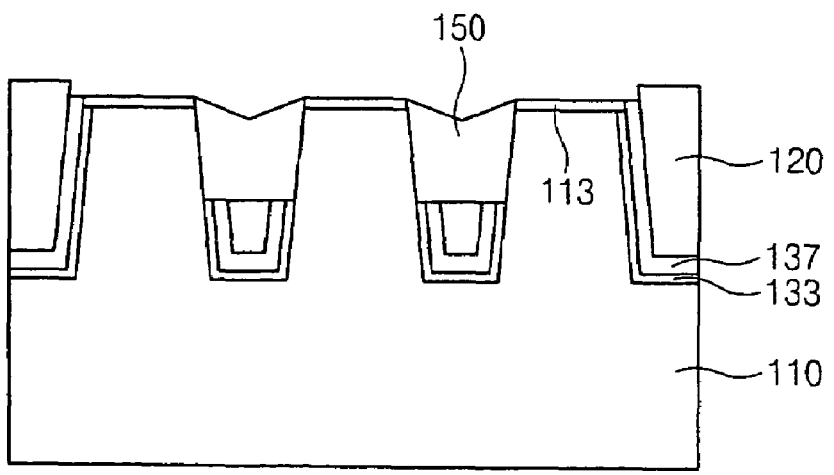
Figure 4H:
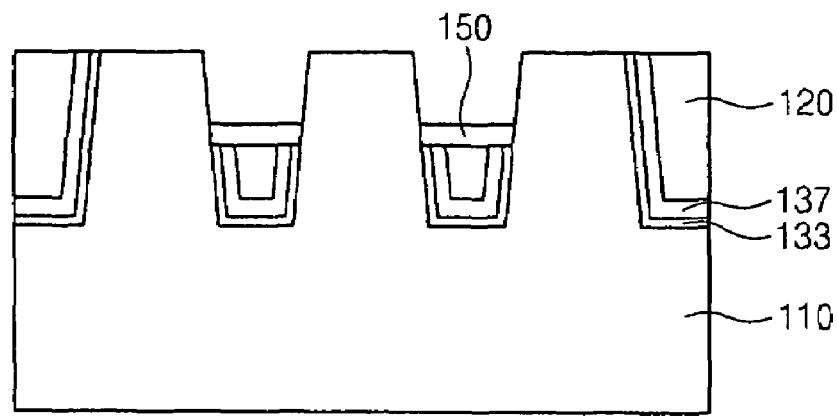

Referring to FIGS. 4g and 4h, an epitaxial layer 150 is formed using the semiconductor substrate 110 exposed at sidewalls of the recess 135 as a seed layer. Next, a predetermined thickness of the epitaxial layer 150 is selectively etched to form a SOI channel region 155 in the recess 135. Thereafter, the pad oxide film 113 is removed to expose the semiconductor substrate 110. In some embodiments, the epitaxial layer 150 is grown by a solid phase epitaxy method, and the thickness of the SOI channel region ranges from about 50 A to about 200 A.

Figure 4I:
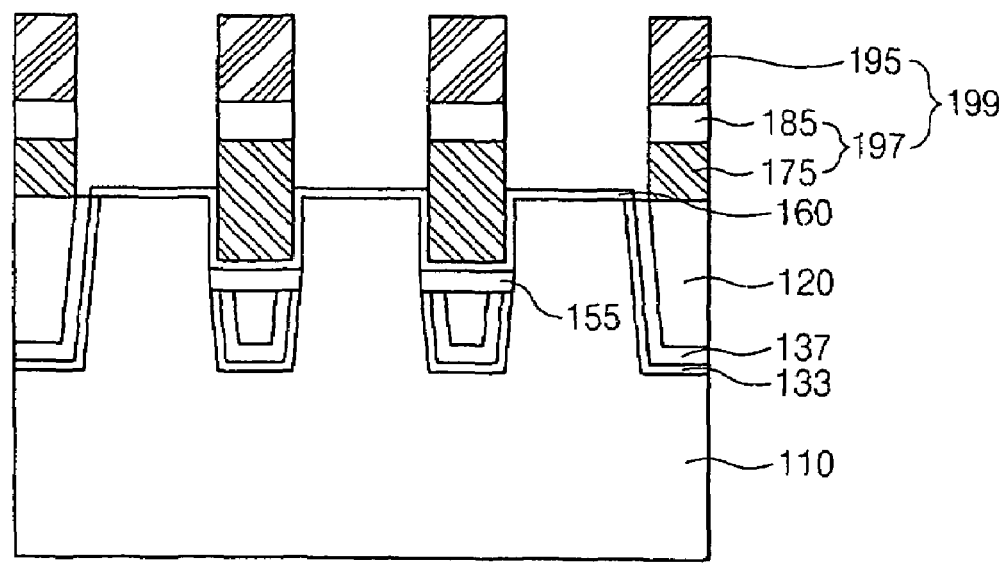

Referring to FIG. 4i, a gate insulating film 160 is formed over the exposed semiconductor substrate 110 including the SOI channel region 155. A planarized lower gate conductive layer 175 filling up the recess 135 is formed. Next, an upper gate conductive layer 185 and a gate hard mask layer 195 are formed over the lower gate conductive layer. Thereafter, the gate hard mask layer, the upper gate conductive layer and the lower gate conductive layer are etched to form a gate 199 which is a stacked structure of a gate electrode 197 and a gate hard mask layer 195.

In addition, subsequent processes such as a process for forming a spacer on a sidewall of the gate, an ion-implantation process for forming source/drain regions in the active regions, a process for forming a landing plug, a process for forming a bit line contact and a bit line, a process for forming a capacitor and a process for forming an interconnect may be performed.

As described above, the method for fabricating a semiconductor substrate in accordance with an embodiment of the present invention provides a channel region formed over a device isolation structure to form a semiconductor device including a SOI (Silicon-on-Insulator) channel structure, thereby decreasing ion implanting concentration of a channel region and improving $t_{WR}$ (Write Recovery time) and LTRAS (Long Time for Row Address Strobe) characteristics of the device. Due to the SOI channel structure, the body effect is also improved. Accordingly, the gate controllability of the device is improved.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for fabricating a semiconductor device, the method comprising:
   (a) forming a device isolation structure defining an active region on a semiconductor substrate having a pad insulating film;
   (b) forming a patterned mask layer over the device isolation structure, the patterned mask layer defining an opening that exposes the device isolation structure and the pad insulating film;
   (c) etching the exposed device isolation structure using the patterned mask layer to form a recess exposing sidewalls of the active region;
   (d) removing the patterned mask layer;
   (e) forming an epitaxial layer in the recess using the exposed sidewalls of the active region as a seed layer;
   (f) selectively etching the epitaxial layer by a predetermined thickness to form a SOI (Silicon-on-Insulator) channel region in the recess;
   (g) removing the pad insulating film to expose the active region;
   (h) forming a gate insulating film over the exposed active region including the SOI channel region;
   (i) forming a gate conductive layer over the gate insulating film; and
   (j) patterning the gate conductive layer to form a gate structure.

2. The method according to claim 1, wherein the active region corresponds to a bit line contact region or a storage node contact region.

3. The method according to claim 1, wherein the opening is a region extending a bit line contact region to neighboring storage node contact regions.

4. The method according to claim 1, wherein the pad insulating film includes a pad oxide film and a pad nitride film.

5. The method according to claim 1, wherein the patterned hard mask layer is selected from the group consisting of a nitride film, a polysilicon film, an amorphous Carbon film, a SiON film and combinations thereof.

6. The method according to claim 1, wherein a process for forming the epitaxial layer is performed by a solid phase epitaxy method.

7. The method according to claim 1, wherein a process for removing the pad insulating film is performed by a wet or dry etching method.

8. The method according to claim 1, wherein the thickness of the SOI channel region ranges from about 50 Å to about 200 Å.

9. The method according to claim 1, wherein the gate conductive layer comprises an upper gate conductive layer and a lower gate conductive layer.

10. The method according to claim 1, wherein forming a device isolation structure includes forming a liner oxide film and a liner nitride film over the semiconductor substrate.

11. The method according to claim 10, wherein a process for removing the liner nitride film is performed by a wet or dry etching method.

12. The method according to claim 10, wherein a process for removing the liner oxide film is performed by an anisotropic etching method.

* * * * *